(12) United States Patent
Poehler

(10) Patent No.: US 9,793,582 B2
(45) Date of Patent: Oct. 17, 2017

(54) METHOD FOR DATA TRANSMISSION ON BATTERY SYSTEMS HAVING A PLURALITY OF CELLS

(71) Applicant: Robert Bosch GmbH, Stuttgart (DE)

(72) Inventor: Joerg Poehler, Korntal-Muenchingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 182 days.

(21) Appl. No.: 14/431,640

(22) PCT Filed: Sep. 9, 2013

(86) PCT No.: PCT/EP2013/068576
§ 371 (c)(1),
(2) Date: Mar. 26, 2015

(87) PCT Pub. No.: WO2014/048704
PCT Pub. Date: Apr. 3, 2014

(65) Prior Publication Data
US 2015/0244033 A1    Aug. 27, 2015

(30) Foreign Application Priority Data
Sep. 26, 2012  (DE) .................. 10 2012 217 369

(51) Int. Cl.
*H01M 10/48* (2006.01)
*H04Q 9/00* (2006.01)
(Continued)

(52) U.S. Cl.
CPC ......... *H01M 10/482* (2013.01); *B60L 3/0092* (2013.01); *B60L 11/1851* (2013.01);
(Continued)

(58) Field of Classification Search
CPC ............ H01M 10/48; H01M 2220/20; H01M 2010/4278; G01R 31/3624; G01R 31/3651; H04Q 9/00
See application file for complete search history.

(56) References Cited

U.S. PATENT DOCUMENTS

| 4,564,798 A | 1/1986 | Young |
| 2012/0106663 A1 | 5/2012 | Zhang et al. |

(Continued)

FOREIGN PATENT DOCUMENTS

JP    WO 2012/043592    * 4/2012 .......... H01M 10/425

OTHER PUBLICATIONS

International Search Report for PCT/EP2013/068576, issued on Dec. 20, 2013.

*Primary Examiner* — Stewart Fraser
*Assistant Examiner* — Monique Wills
(74) *Attorney, Agent, or Firm* — Norton Rose Fulbright US LLP; Gerard Messina

(57) ABSTRACT

A method is provided for transmitting measured data from cells of a battery system, having a plurality of individual cells, to a control device, comprising the steps of identifying a first individual cell for which measured data are to be furnished at a first measured-data quality; identifying at least one further individual cell or which measured data are to be furnished at a second measured-data quality; the first measured-data quality being higher than the second measured-data quality; identifying the first-quality measured data; identifying the second-quality measured data; transferring the first-quality measured data to a control device using a data connection; and transferring the second-quality measured data after the first-quality measured data have been transferred.

12 Claims, 2 Drawing Sheets

(51) Int. Cl.
*B60L 3/00* (2006.01)
*B60L 11/18* (2006.01)
*H01M 10/42* (2006.01)
*G01R 31/36* (2006.01)

(52) U.S. Cl.
CPC ....... *B60L 11/1861* (2013.01); *B60L 11/1866* (2013.01); *H01M 10/48* (2013.01); *H01M 10/486* (2013.01); *H04Q 9/00* (2013.01); *B60L 2240/547* (2013.01); *B60L 2240/549* (2013.01); *G01R 31/3624* (2013.01); *G01R 31/3651* (2013.01); *H01M 2010/4278* (2013.01); *H01M 2220/20* (2013.01); *Y02T 10/7005* (2013.01); *Y02T 10/7044* (2013.01); *Y02T 10/7061* (2013.01)

(56) References Cited

U.S. PATENT DOCUMENTS

2012/0175953 A1* 7/2012 Ohkawa ................ B60L 3/0046
                                                            307/18
2013/0181513 A1* 7/2013 Yano ................... B60L 11/1816
                                                            307/10.1

* cited by examiner

METHOD FOR DATA TRANSMISSION ON BATTERY SYSTEMS HAVING A PLURALITY OF CELLS

FIELD OF THE INVENTION

The present invention relates to rechargeable battery technology in vehicles. The present invention relates in particular to a method for data transmission on battery systems having multiple cells. The present invention further relates in particular to a method for measured data transmission from cells of a battery system having a plurality of individual cells to a control device; to a battery system; to a control device; and to a vehicle, in particular an electric or hybrid vehicle having a battery system according to the present invention and/or a control device for executing the method according to the present invention.

BACKGROUND INFORMATION

For reasons of safety and/or information technology, present-day battery systems, for example traction batteries in the automotive sector, are equipped with a battery management system. A battery management system (BMS) of this kind obtains measured data of individual cells as well as measured variables for the overall battery, and is capable of identifying therefrom, inter alia, an instantaneous battery charge state as well as prognoses of the performance of a battery with regard to charging and discharging, in particular for time periods requested by a main vehicle control device. Calculation algorithms that detect the aging of individual battery cells and ascertain instantaneous battery parameters for the aforementioned algorithms are also utilized.

A first data input to or parameter determination for the charge state algorithms and power prediction algorithms is accomplished on the basis of highly accurate measured data for the current and voltage of individual cells or of the entire battery, from test-stand measurements on the individual battery cells. After installation in a vehicle, however, the cells are subject to time-related aging. This in turn must be detected online in the vehicle so that reparameterization based on cell aging can be carried out.

To allow high-quality reparameterization to be carried out, fast sampling operations for the individual cell voltages and for the current occurring in that context are carried out. A sampling operation is preferably accomplished with a time window <50 ms, for example at a 1-ms interval, in order to exactly detect a voltage dip due to ohmic resistance. For a preferred reparameterization, a synchronous sampling of the individual cell voltages and of the pertinent current can be selected.

FIG. 1 shows an exemplifying embodiment of a hardware architecture of a conventional battery management system.

FIG. 1 has a plurality of individual cells 4 that are connected in known fashion to a cell supervision circuit (CSC) element 6. The individual CSC elements 6 are connected via a data bus 8a to one another and to battery control unit (BCU) element 7. BCU element 7 can have a variety of sensors, for example current measuring sensors, connected to it, and can apply control via relay drivers to relays of battery system 2. The battery management system is connected to further control devices in the vehicle, for example, using a vehicle-internal communication bus 8b, for example a CAN bus.

The measurement of individual voltages of individual cells 4 is handled by the respective CSC element 6 that is connected to the individual cell or cells 4. CSC elements 6 are connected via data bus 8a to the main battery management control system device, i.e. BCU element 7.

FIG. 2 shows an exemplifying embodiment of a CSC element.

An individual voltage measurement of an individual cell 4 is accomplished as a rule via a special component of CSC element 6 which senses the voltages of individual cells 4, as a rule six or twelve individual cells 4; converts these measured values from analog to digital using one or more A/D converters in the individual voltage measurement chip; and sends these ascertained measured values, using bus system 8a, to the main battery management system circuit board, BCU element 7. A CSC element 6 of this kind can furthermore also have a plurality of temperature measurement points.

A so-called "companion chip," which can carry out limit value monitoring with regard to the cell voltages, is usually also provided in CSC element 6 for safety reasons. A cell balancing element can also be provided in CSC element 6 in order to carry out cell balancing of the cells measured by it, or to allow control to be applied to the pertinent semiconductor switches. Cell balancing is known from the existing art and is relevant in particular for the balancing of (different) states of charge (SOC) of individual cells 4 which are connected into an overall package.

The greater the number of cells connected together into a battery system, in particular the more CSC elements 6 that are coupled to one another using a single serial bus, the greater the load on communication bus 8a, due to the fact that individual CSC elements 6 generate their measured values mutually independently and then wish to transfer them via communication bus 8a. Depending on the degree to which such a system has been expanded, this can cause data bus 8a to be completely filled or in fact overloaded.

SUMMARY

One aspect of the present invention can be seen as that of furnishing a method for transmitting measured data from cells of a battery system, in which a small outlay for transmitting charge state algorithms and performance prediction algorithms of required data occurs.

A method for transmitting measured data from cells of a battery system, having a plurality of individual cells, to a control device; a battery system and a control device that are configured to carry out the method according to the present invention; and a vehicle, in particular an electric or hybrid vehicle, having such a battery system and/or control device, are accordingly described in accordance with the independent claims. Preferred embodiments are evident from the dependent claims.

The method according to the present invention represents an economical capability for increasing the expandability or scalability of a battery management system in consideration of a bus load of said systems.

Known systems usually have limited expandability, since the greater the length of a chain of CSC elements, the more the bus load increases as a result of the rising number of cells and the data packets therefore placed by the CSC elements onto the bus. To compensate, conventionally the sampling times are then slowed down or the sampling intervals of the individual cell voltages are increased, although this entails a decrease in measured-value quality or data quality, in particular of an online parameter determination. If battery parameters are no longer ascertained sufficiently often and sufficiently accurately, this reduces the predictive capability of a charge state determination and performance prognosis algorithms.

The method according to the present invention implements a so-called "cell focusing" method that can reduce or prevent overloading of a data bus with no other change in bus parameters. The system according to the present invention provides that specific individual cells are sampled at a CSC element at a high sampling rate, comparable to one in an initial test state, for example 1 ms. Current sampling can occur similarly quickly. At least one of these measured values can be suitably pre-filtered in analog fashion.

An aspect of the present invention is that one specific individual cell is focused on, i.e. selected for analysis. At the same time, this means that the corresponding CSC element to which that cell is connected is also focused on and selected. "Focused on" means in this connection that the measured data are generated at a first quality, in particular at a high quality or very often, and in particular are placed onto a data bus substantially completely and without delay.

This firstly ensures that the focused cell can transmit its measured data to a BCU element of a BMS system substantially without delay and completely, and is not limited by a bus capacity. The measured data of the further cells, i.e. those cells except for the focused cell, are thus written onto the internal bus in delayed fashion or possibly incompletely, possibly with application of suitable digital pre-filtering in the CSC element. This slower pace of writing the non-focused cells onto the internal bus can be configured, for example, such that not all the measured data of a non-focused cell that have been generated by a CSC element, but instead only every tenth, every 100th, or every 1000th value, are transferred. These measured data are referred to hereinafter as those having a "second quality."

The first-quality measured data of the focused individual cell, on the other hand, are placed onto the bus as quickly as possible, in particular as quickly as sampling can be executed. "As quickly as possible" is to be understood in this context in consideration of possible data preparation and data processing in the CSC element. For a particularly preferred parameter identification, the measurement of a current that is loading the focused individual cell, as well as the measurement of the voltage applied to it, are synchronized in time. Such synchronization can be achieved, for example, via a clock message emitted by the main BMS circuit board, with which the focused individual or its focused CSC element, and the current sensor, are synchronized.

A distinction is made in the context of the present invention between two quality levels of measured data, a first quality and a second quality; the first quality has a higher quality or quality level than the second quality or quality level. A first quality or a high quality level contains the fact that an individual cell voltage of a focused individual cell is sampled quickly and, in particular, synchronously in time with the current to that cell, for example at a 1-ms pace. The second quality or lower quality level can refer here to the remaining individual voltages of the remaining individual cells, which are transferred more slowly, and possibly already in digitally filtered form, at a slower pace, for example at a 1-second pace or at a pace of multiplex messages of, for example, a CAN bus. An individual second-quality measured value need not necessarily be poorer than a first-quality one, especially in terms of the resolution and accuracy of the measured value.

Over a specific time period, an online parameter identification is then carried out on a focused individual cell. This time period can be limited on the one hand by a time limit, but preferably by a limit based on convergence of the battery parameters to be identified. In other words, a parameter identification of this kind is carried out until successive parameter values differ from one another only such that the difference, or "delta," of the parameter values falls below a defined limit. Once measurement of a currently focused cell on the basis of this time period is complete, the next individual cell can be focused on as described above, i.e. selected for synchronized current and voltage measurement.

Focused measurement of this kind can also be initiated by a plausibility check that, in the context of observation of normal measured data, i.e. second-quality measured data, detects an operation that is not in standard conformity. Such plausibility checks can take into consideration as the initiator for a selection, for example, a voltage as well as a pertinent current that as a rule do not occur together, or also a specific, for example elevated, temperature gradient of an individual cell. If an unusual operating state is thus detected in a specific individual cell on the basis of the second-quality measured values, that cell can be selected and can be observed with the method according to the present invention, i.e. at a fast pace, so that suitable actions against malfunction of the individual cell can be initiated as applicable.

Embodiments of the invention are depicted in the drawings and are explained further in the description below.

DETAILED DESCRIPTION

Figure 1:
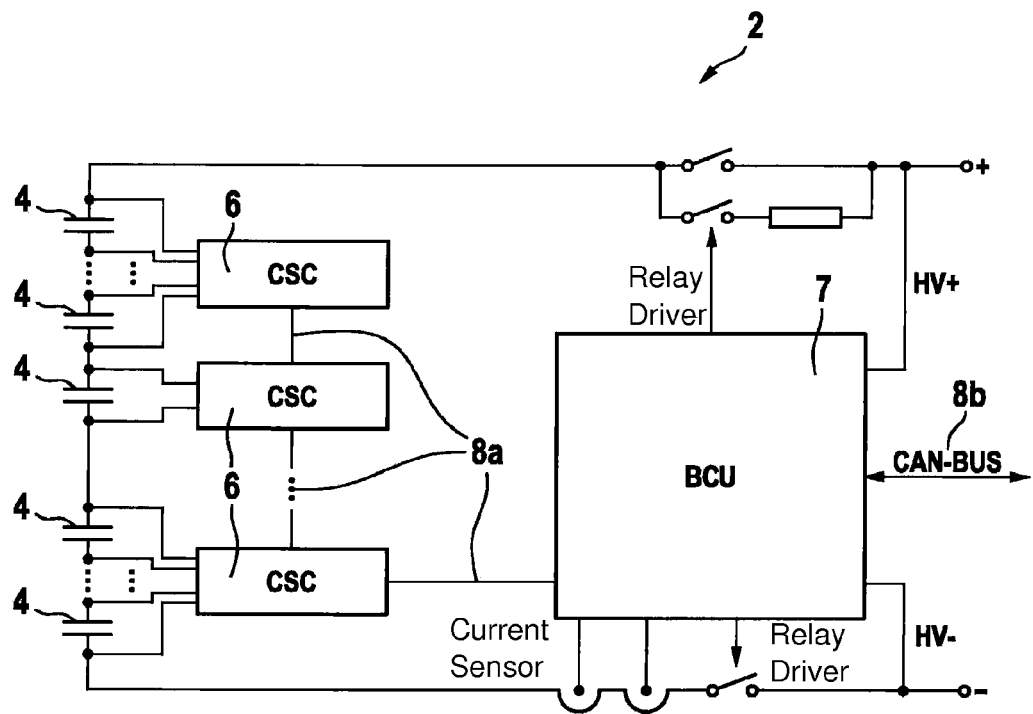
FIG. 1 shows an exemplifying embodiment of a hardware architecture of a conventional battery management system.
Figure 2:
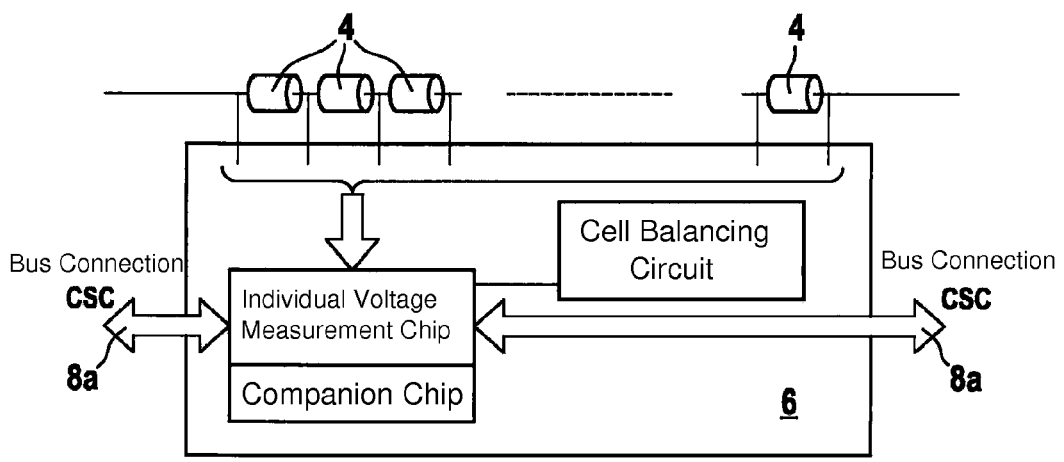
FIG. 2 shows an exemplifying embodiment of a CSC element.
Figure 3:
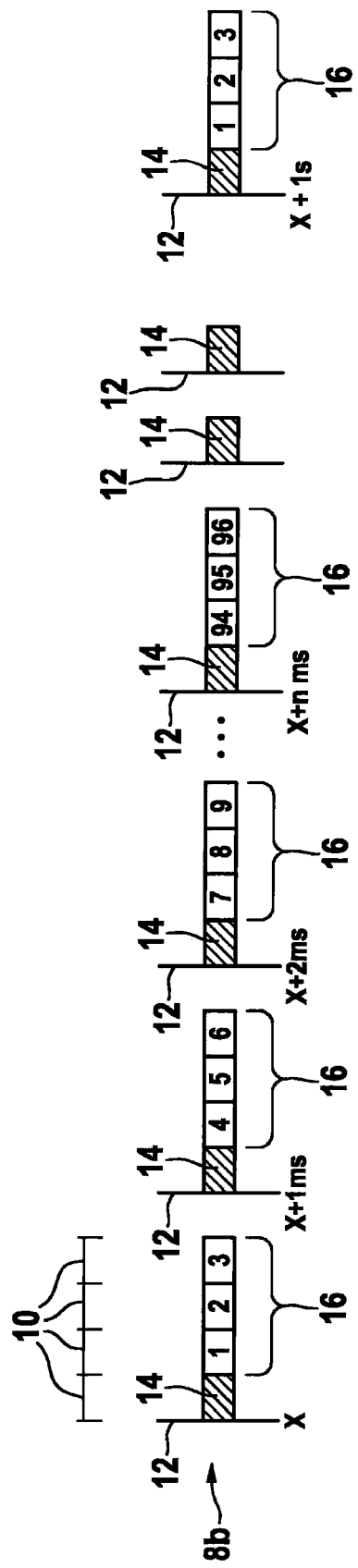
FIG. 3 shows an exemplifying embodiment of a data bus communication in accordance with the present invention.

FIG. 3 shows an exemplifying embodiment of a bus system in which the bus can transfer, by way of example, one data packet every ms, while an individual data packet can be made up of four sub-packets having information items regarding individual cells.

An overall data packet 12 is thus made up of four data packets 10 that can be transferred together via a data bus 8. FIG. 3 depicts by way of example a focused individual cell 4 as well as first-quality measured data 14 belonging to that individual cell 4. As can be gathered from FIG. 3, measured data of this focused individual cell 4 are transferred in each overall data packet 12 for a duration of one second (X to X+1 s). Overall data packet 12 sent out, by way of example, every ms can thus transmit one instantaneous measured value of the focused individual cell 4, i.e. first-quality or high-quality data. These measured data can be forwarded to a BCU element 7, for example, using data bus 8.

Overall data packet 12 furthermore enables the transmission of, for example, a total of four data packets 10 that yield overall data packet 12. Measured data of, by way of example, four individual cells, can thus be transferred every ms in each overall data packet 12. In addition to the consistent transmission of high-quality measured data 14 of focused individual cell 4, bus 8 transmits in each overall data packet 12 measured data 16 of the other individual cells, which represent second-quality measured data. The "quality" can refer here to the accuracy and/or the frequency of transmitted measured data.

In first overall data packet 12 at time X, measured data 16 of the further individual cells 1, 2, 3 are thus transmitted in addition to those of the focused individual cell 4. In overall data packet 12 at time X+1 ms, measured data of the further individual cells 4, 5, 6 are transmitted in addition to measured data 14 of the focused individual cell 4. In overall data packet 12 at time X+2 ms, the data packets 16 are for individual cells 7, 8, and 9 in addition to ones for the focused individual cell 4.

This continues, by way of example, until overall data packet 12 for time X+n ms, at which, by way of example, measured data 16 of individual cells 94, 95, 96 are transferred. On the assumption that second-quality measured data 16 are to be transmitted only once per second, subsequently (by way of example in FIG. 3), exclusively the first-quality measured data 14 of the focused individual cell 4 are transferred between overall data packets 12 of time X+n ms to time X+1 s. The remaining possible data packets 10 can, for example, be omitted. Alternatively, a shorter interval can be selected for the second-quality measured data 16, so that they now repeat, for example, approximately every 30 ms. This embodiment is dependent, however, on a special implementation of a bus system.

FIG. 3 does not depict information possibly required for routing and error correction of the data packets.

The first-quality or high-quality measured data can then be conveyed to the online parameter identification algorithms of a BCU element. Second-quality measured data can be conveyed to other algorithms, for example baseline monitoring algorithms.

Baseline algorithms can also encompass, for example a state-of-charge determination. Assuming that an electric vehicle would run down completely from a 100% state of charge (full charge) in three hours, i.e. would exhibit a discharge rate of C/3, this would equal 180 minutes for a 100% state-of-charge change. If a state-of-charge calculation were then also carried out only every minute, this would mean (in a context of continuous discharge) a 0.55% SOC change every minute. Baseline measured values with a sampling interval of one second would probably be sufficient for this. A state-of-charge determination could thus in fact be carried out every second, although as a rule this is not necessary.

A one-second data determination interval may, however, not be sufficient for determining a performance prognosis, since it often, inter alia, sends prognosis values for one second to a vehicle control device. One possibility here is to use an upstream battery model that calculates a voltage on a substitute basis from quickly sampled current values, and can thereby replace the (possibly absent) measured values required for a performance prognosis. This might be done, for example, using first-quality measured data. With such short time periods between measured values, even a simple, suitably parameterized battery model may be sufficient.

The focused transmission of measured data of an individual cell—the "cell focusing" method of the present invention—thus reduces the bus load on a data bus, in particular an internal bus 8*a* between CSC elements 6 of a battery management system 2, while the quality of parameters ascertained online is increased as compared with known solutions.

The method according to the present invention does not need to be operated continuously; instead, a battery management system can initiate the method at defined time intervals or when second-quality measured data requiring checking are present. The method can thus be switched in only on demand. It is also possible, for example, to provide multiple A/D converters for individual voltage measurement chips of a CSC element, one of these A/D converters being designed with a high clock rate for the method according to the present invention.

What is claimed is:

1. A method for transmitting measured data of a plurality of individual cells of a battery system to a control device, the method comprising:
   identifying a first of the individual cells, the measured data of which are to be transmitted using a data transmission of a first transmission quality;
   identifying at least one further one of the individual cells, the measured data of which are to be transmitted using a data transmission of a second transmission quality, the first transmission quality being higher than the second transmission quality;
   obtaining the measured data of the first of the individual cells;
   obtaining the measured data of the at least one further one of the individual cells; and
   based on the identifications, using a data connection to transmit to the control device the measured data of the first of the individual cells at the first transmission quality and the measured data of the at least one further one of the individual cells at the second transmission quality.

2. The method as recited in claim 1, wherein the first transmission quality is higher than the second transmission quality with respect to at least one of a sample transmission rate and an accuracy with which data is transmitted.

3. The method as recited in claim 1, wherein:
   the transmissions are accomplished using a packet data bus;
   during a period for which the identifications were made:
      a first percentage of the obtained measured data of the first of the individual cells is included in data packets transmitted on the data packet bus; and
      a second percentage of the obtained measured data of each of the at least one further one of the individual cells is included in the data packets; and
   the first percentage is greater than the second percentage.

4. The method as recited in claim 1, wherein the transmission is performed by successively transmitting a plurality of data packets that each includes measured data of the first one of the individual cells and measured data of different ones of the at least one of the further one of the individual cells, without consecutive ones of the data packets including the measured data of any of the at least one of the further one of the individual cells so that a sample transmission rate of the first one of the individual cells is higher than a respective sample transmission rate of each of the at least one further one of the individual cells.

5. The method as recited in claim 1, wherein the measured data contains at least one of measured current data and measured voltage data of an individual cell.

6. The method as recited in claim 1, wherein the identification of the first one of the individual ones of the cells is based on a time interval since a last transmission for the respective individual cell at the first quality, on a temperature of the respective individual cell, and on a measured data value of the first individual cell that had been transmitted at the second transmission quality.

7. The method as recited in claim 1, wherein the identification of the first one of the individual ones of the cells is based on a current/voltage pair of the respective individual cell and on a temperature gradient of the respective individual cell.

8. The method as recited in claim 1, wherein the transmission of the measured data of the first one of the individual cells at the first transmission quality is carried out based on the identifications continually up to at least one of a time limit and until a convergence criterion of the measured data of the first one of the individual cells is reached, during a following period the measured data of the first one of the individual cells being transmitted at the second transmission quality and measured data of one of the at least one further one of the individual cells being transmitted at the first transmission quality.

9. The method as recited in claim 1, further comprising repeating the identifying steps, the obtaining steps, and the transmission with one of the at least one further one of the individual cells being identified as a cell whose measured data is to be transmitted at the first transmission quality and with the first one of the individual cells being identified as a cell whose measured data is to be transmitted at the second transmission quality.

10. A battery system, comprising:
a plurality of individual battery cells; and
a control device, wherein the battery system is configured to carry out a method for controlling transmission of measured data of the cells to the control device, the method including:
identifying a first of the individual cells, the measured data of which are to be transmitted using a data transmission of a first transmission quality;
identifying at least one further one of the individual cells, the measured data of which are to be transmitted using a data transmission of a second transmission quality, the first transmission quality being higher than the second transmission quality;
obtaining the measured data of the first of the individual cells;
obtaining the measured data of the at least one further one of the individual cells; and
based on the identifications, using a data connection to transmit to the control device the measured data of the first of the individual cells at the first transmission quality and the measured data of the at least one further one of the individual cells at the second transmission quality.

11. A vehicle, comprising:
a battery system that includes a plurality of individual battery cells and a control device, wherein the battery system is configured to carry out a method for controlling transmission of measured data of the cells to the control device, the method including:
identifying a first of the individual cells, the measured data of which are to be transmitted using a data transmission of a first transmission quality;
identifying at least one further one of the individual cells, the measured data of which are to be transmitted using a data transmission of a second transmission quality, the first transmission quality being higher than the second transmission quality;
obtaining the measured data of the first of the individual cells;
obtaining the measured data of the at least one further one of the individual cells; and
based on the identifications, using a data connection to transmit to the control device the measured data of the first of the individual cells at the first transmission quality and the measured data of the at least one further one of the individual cells at the second transmission quality.

12. The vehicle as recited in claim 11, wherein the vehicle includes one of an electric vehicle and a hybrid vehicle.

* * * * *